(12) United States Patent
Fu et al.

(10) Patent No.: US 6,238,803 B1
(45) Date of Patent: May 29, 2001

(54) TITANIUM NITRIDE BARRIER LAYERS

(75) Inventors: Jianming Fu, San Jose; Zheng Xu, Foster City; Fusen Chen, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/501,566

(22) Filed: Feb. 9, 2000

Related U.S. Application Data

(62) Division of application No. 09/210,250, filed on Dec. 11, 1998, now abandoned, which is a division of application No. 08/595,446, filed on Feb. 26, 1996, now Pat. No. 5,895,266.

(51) Int. Cl.[7] .................................................. C23C 14/06
(52) U.S. Cl. ......................... 428/472; 428/469; 428/698
(58) Field of Search .................................. 428/472, 469, 428/698

(56) References Cited

U.S. PATENT DOCUMENTS

| | | | |
|---|---|---|---|
| 4,976,839 | 12/1990 | Inoue | 357/71 |
| 5,232,871 | 8/1993 | Ho | 437/190 |
| 5,290,731 | 3/1994 | Sugano et al. | 437/174 |
| 5,292,393 | 3/1994 | Maydan et al. | 156/345 |
| 5,371,042 | 12/1994 | Ong | 437/194 |
| 5,401,675 | 3/1995 | Lee et al. | 437/192 |
| 5,449,641 | 9/1995 | Maeda | 437/763 |
| 5,514,908 | 5/1996 | Liao et al. | 257/751 |
| 5,635,763 | 6/1997 | Inoue et al. | 257/763 |
| 5,750,439 | 5/1998 | Naito et al. | 438/648 |
| 5,763,948 | 6/1998 | Sumi | 257/763 |
| 5,858,184 | 1/1999 | Fu et al. | 204/192.17 |

FOREIGN PATENT DOCUMENTS

| | | | |
|---|---|---|---|
| 545602 A1 | 6/1993 | (EP) | H01L/21/285 |
| 680077 A1 | 11/1996 | (EP) | H01L/21/285 |
| 747499 A1 | 12/1996 | (EP) | C23C/14/06 |
| 747500 A1 | 12/1996 | (EP) | C23C/14/06 |
| 03358193 | 7/1993 | (JP) | C23C/14/34 |
| 1-111666 | 11/1999 | (JP) | H01L/21/285 |

OTHER PUBLICATIONS

Brett et al, "High Rate Planar Magnetron deposition of transparent, conducting, and heat reflecting films on glass and plastic", J. Vac. Sci. Technol. A 1(2), Apr.–Jun. 1983, pp352–355.

Dixit et al, "Reactively sputtered titanium nitride films for submicron contact barrier metallization", Appl. Phys. Lertt. 62 (94), Jan. 25, 1993, pp 357–359.

*Primary Examiner*—Archene Turner
(74) *Attorney, Agent, or Firm*—Birgit E. Morris

(57) ABSTRACT

Improved titanium nitride barrier layers are formed by depositing a first titanium layer; treating this layer with an oxygen plasma to form an oxygen-containing titanium layer thereover; depositing a titanium nitride layer over the oxygen-containing titanium layer; and treating the titanium nitride layer with an oxygen-containing plasma. Robust titanium nitride barrier layers are formed that can prevent spiking by an overlying aluminum contact layer even after heat treatment up to 550° C.

9 Claims, 2 Drawing Sheets

TITANIUM NITRIDE BARRIER LAYERS

This application is a divisional of application Ser. No. 09/210,250 filed Dec. 11, 1998, now abandoned, which is a divisional of Ser. No. 08/595,446, now U.S. Pat. No. 5,895,266 issued Apr. 20, 1999.

This invention relates to improved titanium nitride barrier layers and to a process for making them. More particularly, this invention relates to improved titanium nitride barrier layers that prevent spiking by overlying contact layers.

BACKGROUND OF THE INVENTION

Titanium nitride is a known barrier material used to prevent spiking of metal contacts, such as aluminum, into a silicon substrate. When aluminum is used as a contact material over a silicon substrate, subsequent heat treatment results in interdiffusion between the aluminum and the silicon, forming a conductive path between them that can short out devices. Titanium nitride is used as a barrier between aluminum and silicon.

Titanium nitride can be deposited into contact openings into which aluminum will be subsequently deposited by sputtering a titanium target in the presence of nitrogen and generally an inert gas. It is also known that treatment of a deposited titanium layer with oxygen improves the barrier properties of the titanium nitride layer. Sputtered titanium nitride forms a crystalline material, and spiking can still occur between the interstices of the crystals. Oxygen is adsorbed and fills these interstices, which is known as "stuffing" the titanium nitride. This stuffing has been done traditionally by using a furnace anneal, or heat treatment in a rapid thermal anneal (RTA) chamber with an oxygen-containing atmosphere. While this treatment reduces the spiking problem, both a sputtering chamber and an RTA chamber must be provided.

The adhesion of titanium nitride to silicon has also been improved by sputter depositing a first thin layer of titanium alone in the contact opening. This titanium layer can react with a silicon substrate to form titanium silicide, reducing the resistance of the contact.

A final thin layer of titanium can also be deposited as a wetting layer over the titanium nitride to improve adhesion of an overlying aluminum contact layer.

The deposition of these titanium-containing layers and the oxygen stuffing of the titanium nitride layer can all be carried out in a single sputtering chamber. A titanium target and an inert gas, such as argon, is used to sputter deposit the first layer of titanium; nitrogen gas is added to the chamber and sputtering is continued to form a titanium nitride layer. The oxygen stuffing treatment can be performed in the same chamber by flowing a mixture of oxygen and an inert gas and applying DC power to the target after the titanium nitride deposition.

The titanium nitride can be deposited in two modes; 1) the so-called poisoned mode, in which the titanium target is nitrided and titanium nitride is sputtered from the target; or 2) the metallic mode, in which the target is maintained as metallic titanium, and the titanium is sputtered from the target and reacts with nitrogen on the substrate surface, forming a titanium nitride film on the substrate. The poison mode titanium nitride is not as dense as the metallic mode titanium nitride.

Oxygen stuffing of the titanium layer of a Ti/TiN stack can be used as a barrier layer when titanium nitride is sputter deposited in the metallic mode sputtering method. However, when the titanium nitride is deposited in the poison mode method, the results are less than satisfactory and spiking of an overlying aluminum layer still occurs.

Thus the search for an improved process and improved contacts has continued.

SUMMARY OF THE INVENTION

We have found that improved barrier layers can be deposited in a single sputtering chamber using the poison mode titanium nitride deposition by sequentially sputter depositing a first titanium layer, oxidizing this titanium layer, sputter depositing a titanium nitride layer, oxidizing the titanium nitride layer, and optionally depositing an overlying titanium wetting layer, all in the same chamber. Deposition of an aluminum layer thereover completes the formation of an aluminum contact. Thus the spiking problem is addressed without exposing the substrate to air or removing from a vacuum environment.

DETAILED DESCRIPTION OF THE INVENTION

In accordance with the process of the invention, a first titanium layer is sputter deposited in argon onto a substrate having openings therein for the deposit of aluminum contacts. A sputtering chamber fitted with a DC power source connected to a titanium target is used. This titanium layer is generally deposited at a high DC power of 10,000–12,000 watts with a negative potential applied to the target, and the chamber wall grounded, so that formation of a plasma from argon or other gas is formed in the chamber. Titanium is deposited at a deposition rate of about 1000 Å/min. However, DC power as low as 500 watts can be used. A source of RF power (generally 13.56 MHz) is connected to the substrate support. Using the RF power of 100–200 watts, the typical DC bias developed on the support is about −100V to −200V. After deposition of this first titanium layer, an oxygen-containing gas, such as mixtures of oxygen and argon that can also contain nitrogen, is flowed into the chamber and both the DC and the RF power sources are turned on to create a plasma of the gases in the sputtering chamber. The generated oxygen plasma will form a layer of $TiO_x$, or $TiO_xN_y$ when nitrogen is added.

Oxygen ions and atoms generated in the plasma are more reactive than oxygen molecules, and they diffuse or penetrate into the grain boundaries of the deposited titanium on the substrate more rapidly than oxygen molecules. By adjusting the gas flows and gas flow rates, and by adjusting both the DC and RF power supplies, a desired oxygenated layer of titanium is formed on the substrate over the titanium layer.

The process is continued by shutting off the RF power to the substrate support, while maintaining the DC bias to the target, and sputter depositing titanium nitride in the presence of nitrogen, generally a mixture of nitrogen and argon, in known manner (poison mode).

Oxygen is passed again into the chamber and both the DC and the RF power to the substrate support are turned on to form an oxygen plasma that oxygenates or stuffs the titanium nitride layer. The oxygen plasma is maintained for about 30–60 seconds.

It is important in the present process that the oxygen is added only after the first titanium layer is deposited and after the titanium nitride layer is deposited.

By using a double oxygen deposition, one at the interface between titanium and titanium nitride when the first titanium layer is deposited, and the other at the end of the titanium nitride deposition, spiking does not occur even when an aluminum contact layer is heated up to about 550° C. for one hour.

Figure 1:
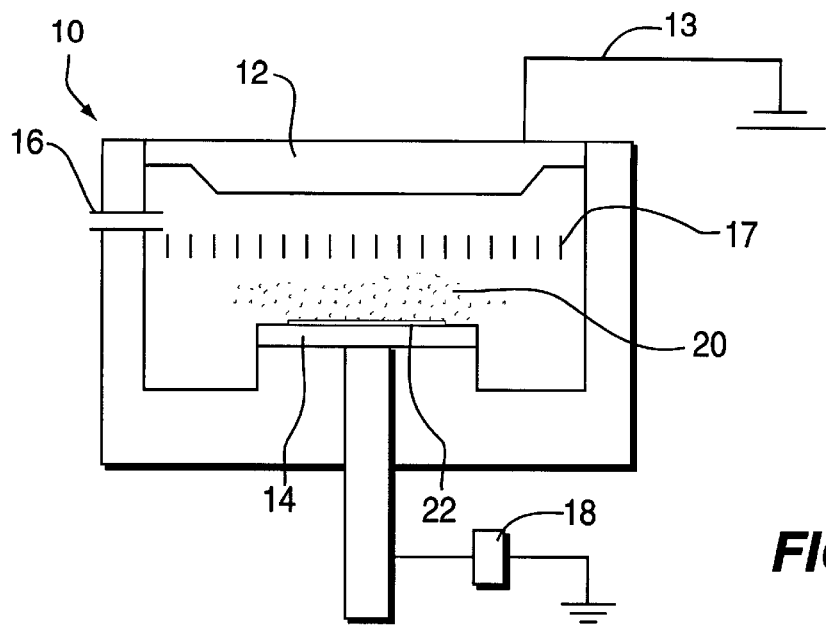
FIG. 1 is a cross sectional view of a sputtering chamber in which the present process can be carried out.

The present process can be carried out in a single sputtering chamber as shown in FIG. 1. A conventional sputtering chamber is modified to add an RF power source to the substrate support. In addition a collimator can optionally be mounted in the chamber between the target and the substrate. A suitable collimator contains a plurality of small openings having an aspect ratio of about 1:1. This permits deposition into contact openings having a high aspect ratio. Sputtered particles above the collimator will not pass through these openings unless they travel in a path that passes through the openings in the collimator. Thus the sputtered particles that reach the substrate can fill small diameter openings without the formation of voids and having an aspect ratio of up to about 2:1. Since the oxygen-containing layers are thin, the effect of oxygenation on TiN film properties, such as reflectance, stress and crystallinity, are minimal.

Referring still to FIG. 1, a sputtering chamber 10 includes a titanium target 12 connected to a DC power source 13, and a substrate support 14. A collimator 17 is mounted between the target 12 and the substrate support 14. A source of RF power 18 is connected to the substrate support 14 to form a plasma 20 between the collimator 17 and the substrate 22 mounted on the support 14. A gas inlet manifold 16 permits various gases to be controllably passed into the chamber. If desired, a second gas inlet can be employed for the oxygen gas to prevent contamination of the other gases, e.g., argon and nitrogen.

The invention will be further described in the following example, but the invention is not meant to be limited to the details described therein.

EXAMPLE

Using a sputtering chamber as in FIG. 1, a layer of titanium about 200–400 Å thick was deposited on a patterned substrate using a DC power of over 10 kilowatts.

An oxygen flow was started of about 50–100 sccm and a plasma formed in the chamber by turning on the DC power and the RF power supply of 100–200 watts. The oxygen treatment was continued for 30 seconds.

The oxygen flow was then turned off and a combined nitrogen and argon flow passed into the chamber. The DC power supply was turned on and from 500–1000 Å of TiN was deposited on the substrate. The power was turned off, a flow of oxygen was started again, and both power supplies turned on again to form an oxygen plasma. Treatment of the TiN layer was also continued for 30 seconds.

A final titanium layer about 400–500 Å thick was then deposited in the same chamber.

The substrate was transferred to an aluminum sputtering chamber and about 8000–8500 Å of aluminum was deposited using the cold/hot process to fill the contact openings.

Figure 2:
FIG. 2 is an SEM photomicrograph of a heat treated aluminum contact of the present invention.

In order to test the contacts, the substrate was heated at 550° C. for one hour. The aluminum metal was then stripped off. Any aluminum spiking appears as a shaped feature, particularly one that extends into the substrate. After examining the openings through a microscope, no spiking was observed. A series of heat treated aluminum contacts made as above are shown in FIG. 2.

Control 1

Figure 3:
FIG. 3 is an SEM photomicrograph of a heat treated aluminum contact of the prior art.

The procedure of the Example was repeated except that no oxygen plasma treatment of the first titanium layer was carried out. Spiking was seen for samples annealed at 550° C. for one hour as shown in FIG. 3.

Control 2

Figure 4:
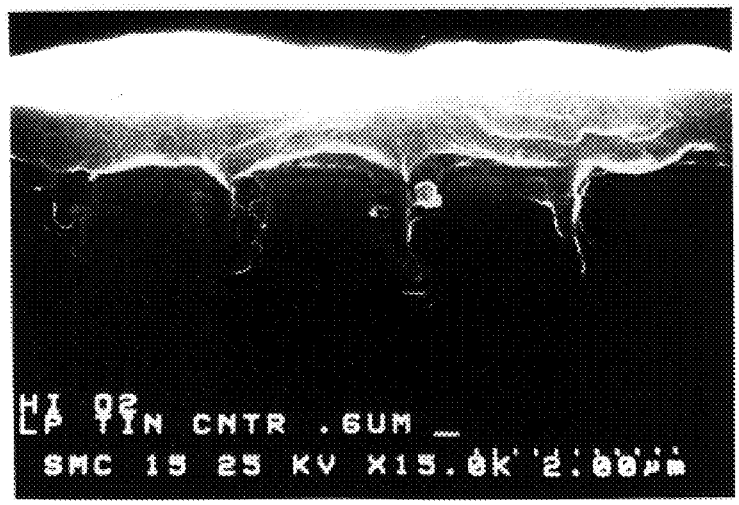
FIG. 4 is an SEM photomicrograph of another embodiment of a heat treated aluminum contact of the prior art.

The procedure of the Example was repeated except that an oxygen plasma treatment of the first titanium layer was carried out but oxygen plasma treatment of the TiN layer was omitted. Spiking was seen for samples annealed at 550° C. for one hour as shown in FIG. 4.

Figure 5:
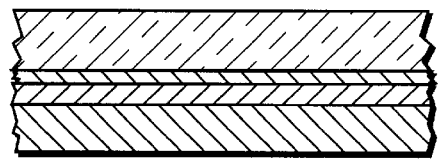
FIG. 5 illustrates an oxygen-containing titanium-titanium nitride stack of the present invention.

Thus applicants have shown that improved barrier properties for a Ti/TiN stack are obtained when both layers are treated with an oxygen plasma at the end of each deposition. The oxygen-containing titanium/titanium nitride stack on a substrate is shown in FIG. 5.

Figure 6:
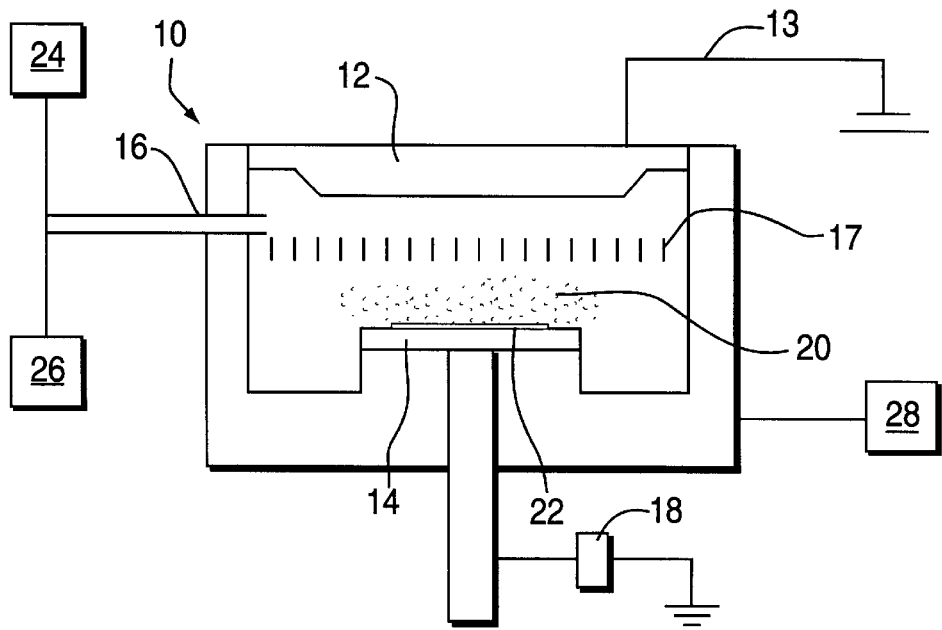
FIG. 6 is a cross sectional schematic view of a system for making stuffed titanium nitride barrier layers.

A computer can be connected to the sputtering chamber as above and can be programmed so as to control the above process automatically, including adjusting the power supplies, starting and stopping the various gas flows and adjusting the gas flow rates, transferring the substrate into and out of the sputtering chamber and the like. This programmed controller and gas sources are connected to the sputtering chamber as shown in FIG. 6. FIG. 6, in addition to the same parts as shown in FIG. 1, further includes one or more gas sources 24, 26, and a programmed computer 28.

Although the present invention has been described in terms of particular embodiments, one skilled in the art will know how to vary the parameters of deposition and the like, and such variations are meant to be included herein. The invention is meant to be limited only by the scope of the appended claims.

We claim:

1. A substrate coated with a first layer of titanium metal, a second layer of oxygen-containing titanium thereover in contact with the first layer, a third layer of titanium nitride over and in contact with the second oxygen-containing titanium layer, and a second oxygen-containing titanium layer over said third layer.

2. A substrate according to claim 1 having a plurality of contact openings formed therein.

3. A substrate according to claim 2 wherein an aluminum layer is deposited over said second oxygen-containing titanium layer.

4. A substrate according to claim 1 wherein a second layer of titanium metal is deposited over the oxygenated second oxygen-containing titanium layer.

5. A substrate according to claim 4 wherein an aluminum layer is deposited over said second layer of titanium metal.

6. A substrate coated with a first layer of titanium metal, a second layer of oxygen-containing titanium in contact with the first layer, a third layer of titanium nitride over and in contact with the second layer, and a fourth layer of an oxygen- and titanium-containing layer in contact with the third layer.

7. A substrate according to claim 6 wherein the fourth layer is titanium oxide.

8. A substrate according to claim 6 wherein the fourth layer is titanium oxynitride.

9. A substrate coated with a first layer of titanium metal, a second layer of oxygen-containing titanium in contact with the first layer, a third layer of titanium nitride over and in contact with the second layer, a fourth layer of an oxygen-and-titanium-containing layer in contact with the third layer, and a fifth layer of titanium over and in contact with the fourth layer.

* * * * *